United States Patent [19]

Ohtsuka et al.

[11] Patent Number: 5,221,638

[45] Date of Patent: Jun. 22, 1993

[54] METHOD OF MANUFACTURING A SCHOTTKY BARRIER SEMICONDUCTOR DEVICE

[75] Inventors: Koji Ohtsuka, Kawagoe; Noriyoshi Ohmuro, Kamifukuoka; Gen Koreeda, Tokyo, all of Japan

[73] Assignee: Sanken Electric Co., Ltd., Saitama, Japan

[21] Appl. No.: 900,440

[22] Filed: Jun. 18, 1992

[30] Foreign Application Priority Data

Sep. 10, 1991 [JP] Japan ................. 3-230186
Sep. 10, 1991 [JP] Japan ................. 3-230187

[51] Int. Cl.$^5$ .............................. H01L 21/283
[52] U.S. Cl. ..................... 437/175; 437/177;
                            437/235; 148/DIG. 140
[58] Field of Search ............. 437/175, 176, 177, 179,
                    437/235; 148/DIG. 140; 257/471, 473

[56] References Cited

U.S. PATENT DOCUMENTS

| 4,215,156 | 7/1980 | Dalal et al. | 437/175 |
|---|---|---|---|
| 4,379,832 | 4/1983 | Dalal et al. | 437/175 |
| 4,545,115 | 10/1985 | Bauer et al. | 437/179 |
| 5,081,510 | 1/1992 | Ohtsuka et al. | 357/15 |
| 5,112,774 | 5/1992 | Ohtsuka et al. | 437/175 |

FOREIGN PATENT DOCUMENTS

63-94673 4/1988 Japan.
63-94674 4/1988 Japan.

Primary Examiner—T. N. Quach
Attorney, Agent, or Firm—Bachman & LaPointe

[57] ABSTRACT

According to the present invention, there is provided a method of manufacturing a Schottky barrier semiconductor device with lesser variation of barrier height $\phi B$ which may stably be adjusted in a wide range. A Schottky barrier is formed by combination of an electrode layer, a Ti thin layer and Al layer. The Ti thin oxide layer between the Ti thin and Al layers may prevent variation of barrier height $\phi B$ during heat treatment. By controlling vacuum.

4 Claims, 3 Drawing Sheets

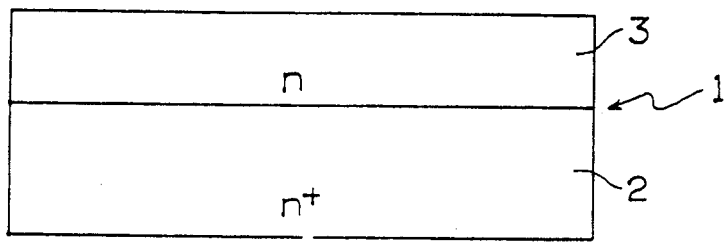
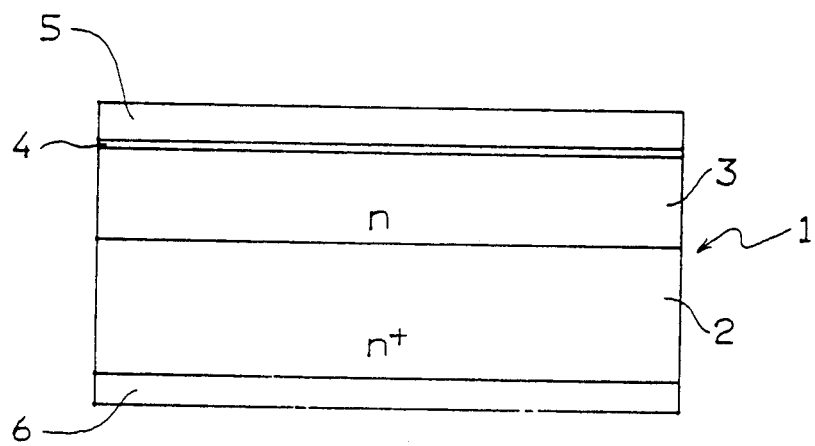
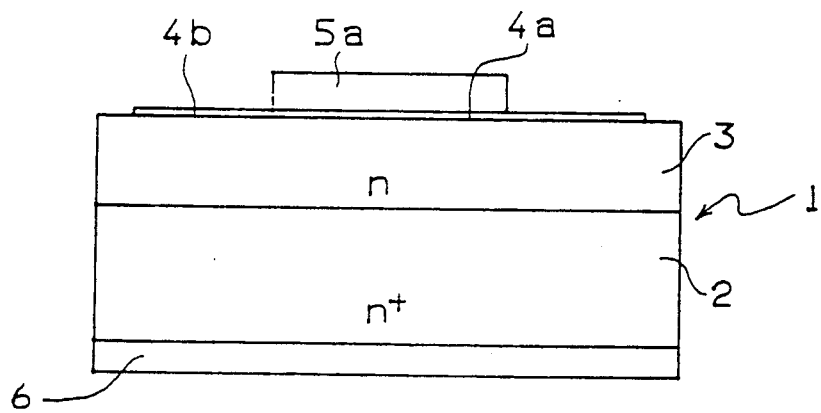

METHOD OF MANUFACTURING A SCHOTTKY BARRIER SEMICONDUCTOR DEVICE

BACKGROUND OF THE INVENTION

The present invention relates to a method of manufacturing a Schottky barrier semiconductor device, and more particularly, to an improvement for minimizing variations in the barrier height $\phi B$ which would occur by heat treatment or use of the semiconductor device for a long period of time.

It is known that a barrier height $\phi B$ predominantly determines the properties of a Schottky barrier formed by combination of a semiconductor region and a barrier electrode. It is also found that the barrier height $\phi B$ tends to vary after heat treatment which is carried out for stabilization after completion of the semiconductor device. Specifically, the characteristic of Schottky barriers indicates that the reverse current leakage is decreased with a high level of the barrier height $\phi B$ and with increase of voltage drop of forward direction. Adversely, the voltage drop of the forward direction is decreased with a low level of the barrier height $\phi B$ and with increase of the reverse current leakage. Accordingly, it is desired that the barrier height $\phi B$ is adjustable in response to required electric properties.

However, the barrier height $\phi B$ of the Schottky barrier is predominantly determined depending on kind of a used barrier metal. Also, the barrier height $\phi B$ may tend to vary by heat treatment, and therefore it is difficult to stably control the barrier height $\phi B$ in a wide range.

Accordingly, an object of the present invention is to provide a method of manufacturing a Schottky barrier semiconductor device whose barrier height $\phi B$ may stably be adjusted to a desired level in a wide range.

SUMMARY OF THE INVENTION

The method of the present invention for manufacturing a Schottky barrier semiconductor device comprises the steps of: forming a first electrode layer by vacuum evaporation of a metal on a main surface of a semiconductor region, the metal being capable of producing a Schottky barrier in combination of the semiconductor region; exposing the first electrode layer to an atmosphere under a pressure in a range of $1\times 10^{-6}$ to $1\times 10$ torr; and forming on the first electrode layer a second electrode layer which is a metal capable of producing a Schottky barrier in combination of the semiconductor of the semiconductor region, first and second electrode layers. The barrier height of the Schottky barrier is formed to a desired level by controlling vacuum degree of the atmosphere to which the first electrode layer is exposed. The semiconductor may be selected from groups of silicon, or III–V group compound such as InP, GaAsP, AlGaAs, GaAs. The first electrode layer has the thickness of 10 to 100 Angstroms, preferably of 20 to 80 Angstroms. The first electrode layer comprises Ti, and the second electrode layer comprises Al.

A very thin absorbed layer is formed on a surface of the first electrode layer. The term "very thin" used in this specification means a thickness capable of producing a quantum-mechanical tunneling effect. The absorbed layer results in a stable barrier height on a desired level. For instance, if the first and second electrode layers are formed respectively of Ti (titanium) and Al (Aluminum), height of the resulting Schottky barrier is on a lower and stable level with increase of the vacuum degree of the atmosphere for the first Ti electrode. Adversely, the height of the Schottky barrier comes to a higher and stable level with decrease of the vacuum degree.

BRIEF DESCRIPTION OF THE DRAWINGS

FIG. 1 illustrates a semiconductor substrate used in the process of manufacturing a Schottky barrier semiconductor device according to the present invention.

FIG. 2 shows a sectional view of the semiconductor substrate of FIG. 1 with a Ti thin layer and an Al layer formed thereon.

FIG. 3 exhibits a sectional view of the semiconductor substrate of FIG. 2 in which each periphery of the Ti thin and Al layers is removed.

DETAILED DESCRIPTION OF THE EMBODIMENT

Figure 4:
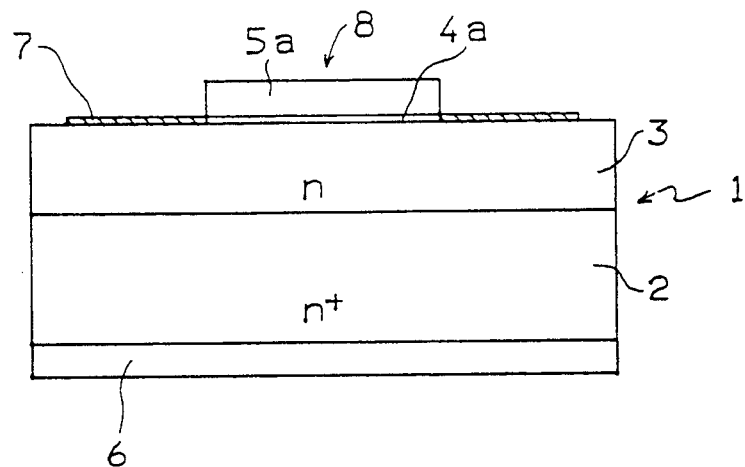
FIG. 4 indicates a sectional view of the semiconductor substrate of FIG. 3 after oxidization of the Ti thin layer.
Figure 5:
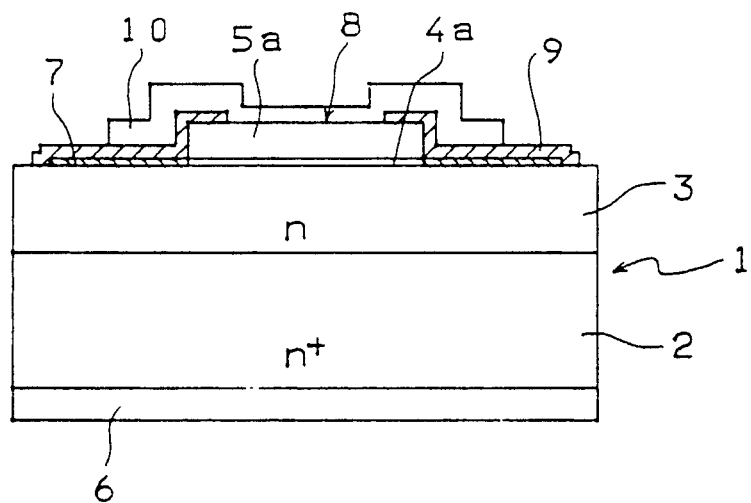
FIG. 5 illustrates a sectional view of the semiconductor substrate of FIG. 4 formed with an insulating layer and connecting electrodes.

The following will describe a best mode of the present invention directed to a method of manufacturing a power Schottky barrier diode with reference to FIG. 1 through FIG. 6.

As shown in FIG. 1, a semiconductor substrate (1) of GaAs (gallium arsenide) was prepared comprising a n+ type region (2) and n type region (3) formed thereon by epitaxial growth. Then, as shown in FIG. 2, a Ti thin layer (a first electrode layer) (4) was formed on the n type region (3). Ti can produce a Schottky barrier in a combination with the n type region (3) of GaAs. The semiconductor substrate (1) was placed within a chamber under pressure less than $1\times 10^{-6}$ torr when the Ti thin layer (4) was formed as a deposit of approximately 50 Angstroms thickness by vacuum evaporation entirely on a main surface of the semiconductor substrate (1). After completion of formation of the Ti thin layer (4), the vacuum degree of pressure within the chamber was once lowered to different three levels of $1\times 10^{-6}$ torr, $1\times 10^{-5}$ torr and $1\times 10^{-4}$ torr to expose the Ti thin layer (4) of n type region (3) to an atmosphere of each of these three lower vacuum degrees for a predetermined period of time. Ten samples of the Ti thin layer (4) were subjected to each of these three vacuum degrees. During this operation, oxygen or other atoms contained in the chamber was absorbed on the Ti thin layer (4) thereby to form a very thin absorbed layer on a surface of the Ti thin layer (4). Then, Al was evaporated and deposited on an entire surface of the Ti thin layer (4) through the absorbed layer to form an Al layer (a second electrode layer) (5) of approximately 2 micrometers thickness. When Al was evaporated, pressure within the chamber was again kept in a lower level less than $1\times 10^{-1}$. Also, an electrode (6) of ohmic contact comprising an alloy of Au (gold)-Ge (germanium) was formed on a bottom surface of n+ type region (2).

Then, as shown in FIG. 3, a periphery of the Al layer (5) was removed by a photo-etching process to form an Al layer (5a) which provides a main passage for forward current at the center of the semiconductor substrate (1) and corresponds to an area to form a Schottky barrier. In addition, a periphery of the Ti thin layer (4) was removed by a photo-etching process to form a Ti thin layer (4a) under the Al layer (5a) and a Ti thin layer (4b) which surrounds the layer (4a).

Subsequently, oxidation process with air was carried out to the semiconductor chip under heating at a temperature of 380° C. for five to thirty minutes. As illustrated in FIG. 4, the Ti thin layer (4b) uncovered with the Al layer (5a) was oxidized to a thin layer (7) of titanium oxide, however the Ti layer (4a) under the Al layer (5a) was not oxidized due to masking by the Al layer (5a). Since both of Al and Ti may produce a Schottky barrier in combination of n type GaAs semiconductors, the term "barrier electrode (8)" is referred to as indicating the combined Ti thin layer (4a) and Al layer (5a).

Next, an upper surface of the Ti oxide thin layer (7) was coated with an insulating film (9) of silicon oxide formed by Plasma CVD (Chemical Vapor Deposition) method. In addition, a terminal electrode (10) of Al was formed on upper surfaces of the Al layer (5) and insulating film (9), thus resulting in a power Schottky barrier diode.

In this embodiment of the invention for the power Schottky barrier diode, a first Schottky barrier is produced by combination of the barrier electrode (8) and n type region (3), and a second Schottky barrier is produced by combination of the Ti oxide thin layer (7) and n type region (3). In an imaginary planar view, the second Schottky barrier is formed adjacent to and circularly surrounds the first Schottky barrier. When electrode current flow passes through the Ti oxide layer (7), it serves as a resistive Schottky barrier field plate to improve breakdown strength. Regarding the resistive Schottky barrier field plate, reference is made to U.S. Pat. No. 5,027,166 in the name of Kouji Otsuka et al.

Figure 6:
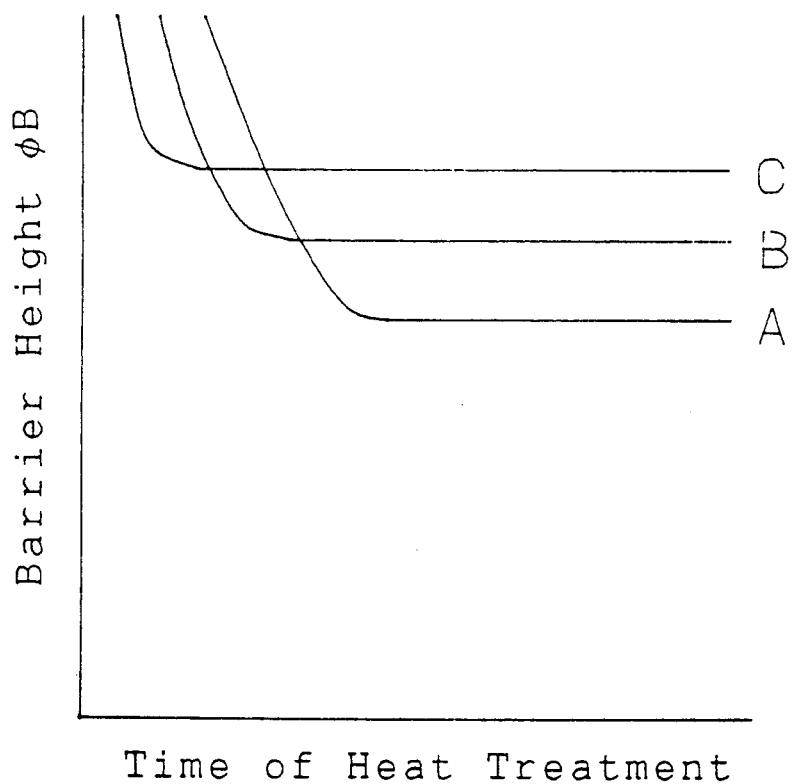
FIG. 6 illustrates a graph indicating change of the barrier height to time of heat treatment for stabilization of barrier height in a Schottky barrier diode prepared in accordance with an embodiment of the present invention.

FIG. 6 shows a graph schematically indicating the relationship between time of heat treatment and variations of barrier height $\phi B$ when heat treatment is applied on the Schottky barrier diode chip manufactured in accordance with the present embodiment. The Schottky barrier of this case is provided by composite electrodes of the first and second electrode layers. Full lines A, B and C shown in FIG. 6 denotes respectively variation in the barrier height $\phi B$ under pressure of respectively $1 \times 10^{-6}$ torr, $1 \times 10^{-5}$ torr and $1 \times 10^{-4}$ torr with respect to time of heat treatment.

FIG. 6 exhibits that the height of the first Schottky barrier becomes a higher level in its stable condition with lower level of vacuum degree within the evaporation chamber for the Ti electrode, and that adversely, it becomes a lower level in its stable condition with higher level of vacuum degree within the chamber. The initial value of the height $\phi B$ of the fist Schottky barrier, namely the level of the barrier height before heat treatment is approximate to an initial value of height of the Schottky barrier produced from a structure wherein the Al layer is formed in direct contact with n type region. Assuming a symbol "n" represents an ideal coefficient for a Schottky barrier diode of the barrier height $\phi B$, all of n values of the Schottky barrier diodes produced in accordance with these methods are in a range of 1.01 to 1.05, and therefore it has been found that they are excellent diodes without any defect in practice.

As above-mentioned, the level of the barrier height of a Schottky barrier diode may stably be controlled in a wide range by virtue of variation of the vacuum degree without utilizing other metals for barrier electrode.

Although it is believed very difficult to fully elucidate the technical reason for stably controlling height of the fist Schottky barrier in a wide range, it may be presumed that the absorbed layer would effectively prevent mutual reaction of the al layer (5), Ti thin layer (4) and n type region (3), while the very thin absorbed layer has its thickness capable of producing a quantum-mechanical tunneling effect. The absorbed layer is formed by absorption of oxygen molecules or other residual gas molecules to the upper surface of the Ti thin layer (4) when it is exposed to an atmosphere of low vacuum degree. Accordingly, the absorbed amount of oxygen molecules or the residual gas molecules is increased with lower vacuum degree of the atmosphere for the Ti thin layer (4) so that the absorbed layer would enhance to prevent the mutual reaction of the Al layer (5), Ti thin layer (4) and n type region (3). thereby to stably keep the barrier height on a high level.

It will be appreciated that modifications may be made to the foregoing embodiment of the present invention as described below.

(1) The present invention is applicable to a Schottky barrier semiconductor device employing silicon or III-V group compound such as indium phosphate (InP), GaAsP or AlGaAs in lieu of GaAs.

(2) The first electrode layer desirably has the thickness in the range of 10 to 100 Angstroms, more preferably in the range of 20 to 80 Angstroms to preferable form the first Schottky barrier. In the above embodiment, if thickness of the first electrode layer is increased, the height of the Schottky barrier may be in a low level, and adversely if thickness of the first electrode layer is decreased, the height of the Schottky barrier may be in a high level. Controlled range may become wider in the invention in combination of control to thickness of the first electrode layer.

(3) When the first electrode layer is formed by vacuum evaporation, pressure within the chamber may preferably have the vacuum degree higher than $1 \times 10^{-4}$ torr.

It should be appreciated that the method according to the present invention can provide a semiconductor device with a Schottky barrier on a desired level of barrier height $\phi B$.

What is claimed is:

1. A method of manufacturing a Schottky barrier semiconductor device, comprising the steps of:

forming a first electrode layer by vacuum evaporation of a metal on a main surface of a semiconductor region in an atmosphere under a relatively low pressure of less than $1 \times 10^{-6}$ torr, said metal being capable of producing a Schottky barrier in combination with said semiconductor region;

exposing said first electrode layer to an atmosphere containing a residual gas under relatively high pressure conditions in the range of at least $1 \times 10^{-6}$ torr up to $1 \times 10$ torr, for a time sufficient to enable absorption of said residual gas within an upper surface of said first electrode layer so as to form a very thin absorbed layer;

forming, on said first electrode layer under a relatively low pressure of less than $1 \times 10^{-6}$ torr, a second electrode layer of a metal capable of producing a Schottky barrier in combination with said semiconductor region so as to form a Schottky barrier based on a combination of said semiconductor region and said first and second electrode layers; and controlling the level of barrier height $\phi B$ in said Schottky barrier through control of said pressure conditions of the atmosphere within the range of $1 \times 10^{-6}$ torr to $1 \times 10$ torr during exposure of said first electrode layer to the atmosphere at said relatively high pressure.

2. The method of manufacturing a Schottky barrier semiconductor device of claim 1, wherein said exposing step comprises exposing said first electrode layer to an atmosphere containing oxygen.

3. The method of manufacturing a Schottky barrier semiconductor device of claim 1, wherein said semiconductor region is formed by a material selected from the group of silicon and a III-V group compound.

4. The method of manufacturing a Schottky barrier semiconductor device of claim 1 wherein said semiconductor region is formed by at least one of InP, GaAsP, AlGaAs and GaAs.

* * * * *